(12) United States Patent
Grills et al.

(10) Patent No.: US 9,068,816 B2
(45) Date of Patent: Jun. 30, 2015

(54) CAPACITOR SENSORS AND SYSTEM AND METHODS FOR NON-CONTACT OBJECT DETECTION

(75) Inventors: Reginald C. Grills, Oshawa (CA); Wasim Tahir, Ajax (CA); Yarko Matkiwsky, Whitby (CA); Gary Warren, Aurora (CA); Allan Chun, Brooklin (CA); Steve Gary Steane, Courtice (CA)

(73) Assignee: Flextronics Automotive Inc., Newmarket, Ontario (CA)

( * ) Notice: Subject to any disclaimer, the term of this patent is extended or adjusted under 35 U.S.C. 154(b) by 772 days.

(21) Appl. No.: 13/302,511

(22) Filed: Nov. 22, 2011

(65) Prior Publication Data

US 2013/0127479 A1    May 23, 2013

(51) Int. Cl.
| | |
|---|---|
| *G01R 27/26* | (2006.01) |
| *G01B 7/14* | (2006.01) |
| *G01D 5/24* | (2006.01) |
| *E05F 15/46* | (2015.01) |

(52) U.S. Cl.
CPC .............. *G01B 7/14* (2013.01); *G01R 27/2605* (2013.01); *G01D 5/24* (2013.01); *E05F 15/46* (2013.01)

(58) Field of Classification Search
CPC ....... E05F 15/0073; G01B 7/14; G01B 7/003; G01B 7/023; G01R 27/26; G01R 27/2605; G01R 27/28; G01R 27/32; G01R 27/02; G01R 31/2648; G01R 31/265; G01R 31/2805; G01R 31/2812; G01R 31/2889; G01R 31/024; G01R 31/303; G01R 31/305; G01R 31/307; G01R 31/311; G01R 31/312; G01R 3/00; G01R 1/30; G01R 1/06716; G06K 9/0002; G01D 5/24; G01C 19/5719; G01L 9/12; B60L 13/06; B60L 2200/26; H03K 17/9505
USPC ............ 324/684, 658, 649, 600, 686, 754.28, 324/754.27, 754.21, 754.01, 537, 207.26, 324/207.11, 679
See application file for complete search history.

(56) References Cited

U.S. PATENT DOCUMENTS

| | | | |
|---|---|---|---|
| 5,337,039 A | 8/1994 | Simon | |
| 5,801,340 A | 9/1998 | Peter | |
| 7,187,282 B2 | 3/2007 | Fergusson | |
| 7,295,031 B1 * | 11/2007 | Parker et al. | ............. 324/754.28 |
| 7,639,095 B2 * | 12/2009 | Ocket et al. | .................... 331/151 |
| 2008/0203977 A1 * | 8/2008 | Raimar et al. | ................ 320/166 |
| 2009/0051355 A1 * | 2/2009 | Yamakawa | ............... 324/207.26 |

* cited by examiner

*Primary Examiner* — Hoia-An D Nguyen
(74) *Attorney, Agent, or Firm* — Volpe and Koenig, P.C.

(57) ABSTRACT

A non-contact object detection system includes a capacitor sensor and a control system, the control system providing a AES (Adaptive Excitation Signal) to the capacitor sensor, the AES (Adaptive Excitation Signal) configured according to an environment in which the capacitor sensor is deployed, the AES (Adaptive Excitation Signal) configured to produce a threshold voltage from the capacitor sensor to the control system in the environment when an object is not in a detection area of the capacitor sensor.

12 Claims, 9 Drawing Sheets

CAPACITOR SENSORS AND SYSTEM AND METHODS FOR NON-CONTACT OBJECT DETECTION

BACKGROUND

The Federal Motor Vehicle Safety Standard (FMVSS) specifies requirements for all power operated closure systems to avoid/minimize the likelihood of death or injury from the accidental operation. Power closures like Power Sliding Doors and Power Lift Gates carry significant masses and huge inertia while in motion. The FMVSS-118 specifies a maximum contact pressure for unattended closure systems. It's always been a challenge with these systems to achieve federal safety standards in all their operational modes.

Power closures like Power Sliding Doors and Power Lift Gates carry significant masses and huge inertia while in motion and can hurt/injure people or objects during unattended closures. Current technologies mostly use Hall Effect based speed control algorithm for contact based obstacle detection. Speed control directly related to momentum and in turn energy imparted on an obstacle. For any given moving mechanism with a given weight, the pinch force imparted on an object can be calculated as a function of velocity. Huge characterization effort is required during the development time to characterize the system for environmental changes, voltage variation, vehicle slope, etc to optimize obstacle detection

BRIEF SUMMARY

The Flextronics Capacitive Sensor is a design which integrates with a motion controller and looks for the objects in the closure aperture during the movement of the closure system, and offers zero (0) contact force/pressure. This system is able to detect from close proximity a human body to a child finger, to various inanimate objects, from a defined programmable distance. If there is an object, the system sends an obstacle signal to the main micro to perform the desired reaction. This system is configurable on the fly for non-contact or touch based obstacle detection. The controller continuously reads the capacitive sensor analog/digital output to determine if there is any object in the path of the moving system. The sensor prohibits the closure from touching the object and will stop and or reverse its direction. The closure system may detect the object, slow down and slightly touch the object. At this point, the system may reverse to its fully opened position or if the object is removed prior to reversing the closure system may ramp up to its specified speed and complete the closing cycle. The Capacitive Sensor generates an electrical field. Intrusions into this field are detected allowing the control system to react without contact. The field covers the closure aperture depending on the application. Any intrusion into the field changes the intensity of the electric field. The capacitive electronics in turn senses that change in field and generates an analog/digital voltage proportional to change in field. The control micro samples the sensor voltage and decides about the object presence in the field proximity and takes necessary action.

In one embodiment, a non-contact object detection system includes a capacitor sensor and a control system, the control system providing a AES (Adaptive Excitation Signal) to the capacitor sensor, the AES (Adaptive Excitation Signal) configured according to an environment in which the capacitor sensor is deployed, the AES (Adaptive Excitation Signal) configured to produce a threshold voltage from the capacitor sensor to the control system in the environment when an object is not in a detection area of the capacitor sensor. Optionally, the capacitor sensor provides a detection voltage to the control system when an object is in the detection area and the detection voltage is different from the threshold voltage. In one alternative, the control system includes instructions for automatically configuring the AES (Adaptive Excitation Signal) and the control system is configured to execute the instructions. Optionally, the instructions include a module for determining whether the threshold voltage is within an upper baseline limit and a lower baseline limit of the capacitor sensor. In one alternative, the instructions include a module for adjusting the AES (Adaptive Excitation Signal) according to the environment to achieve the threshold voltage. In some configurations, the environment is a powered door of a vehicle. The non-contact object detection system may further include a modulator configured to receive a first clock signal from the control system, the modulator interconnected with the capacitor sensor, a synchronous demodulator configured to receive a first signal from the capacitor sensor, a second clock signal from the control system, and a third clock signal from the control system to demodulate the signal from the capacitor sensor, and an amplifier configured to amplify a second signal from the synchronous demodulator and provide an analog output signal to the control system. The analog output signal is indicative of whether an object is in the detection area. Optionally, the capacitor sensor includes a guard and the guard is covered with an environmentally protective coating.

In one embodiment, a method of detecting an object in a detection area of a capacitor sensor deployed in a motor vehicle automatic access portal, or closure aperture, includes providing a AES (Adaptive Excitation Signal) to the capacitor sensor from a control system. The method further includes sensing a detection voltage produced from the capacitor sensor. The method further includes comparing the detection voltage to a threshold voltage and based on the comparison determining whether the object is in the detection area. The method may further include automatically configuring the threshold voltage according to an instruction executed by the control system, the threshold voltage being indicative of the voltage produced by the capacitor sensor when no object is present in the detection area. The instructions may include adjusting the AES (Adaptive Excitation Signal) in order to set the threshold voltage between an upper and lower baseline for the capacitor sensor. The instruction may include adjusting the AES (Adaptive Excitation Signal) to a lower frequency if the threshold voltage is not less than the upper baseline. The instructions may also include adjusting the AES (Adaptive Excitation Signal) to a higher frequency if the threshold voltage is not greater than the lower baseline. The instructions may include providing an indication that the capacitor sensor is faulty if the AES (Adaptive Excitation Signal) cannot be adjusted to provide a threshold voltage between the upper and lower baseline.

BRIEF DESCRIPTION OF THE DRAWINGS

The foregoing objects, advantages, and features, as well as other objects and advantages, will become more apparent with reference to the description and drawings below, in which like numerals represent like elements and in which.

DETAILED DESCRIPTION

Figure 1:
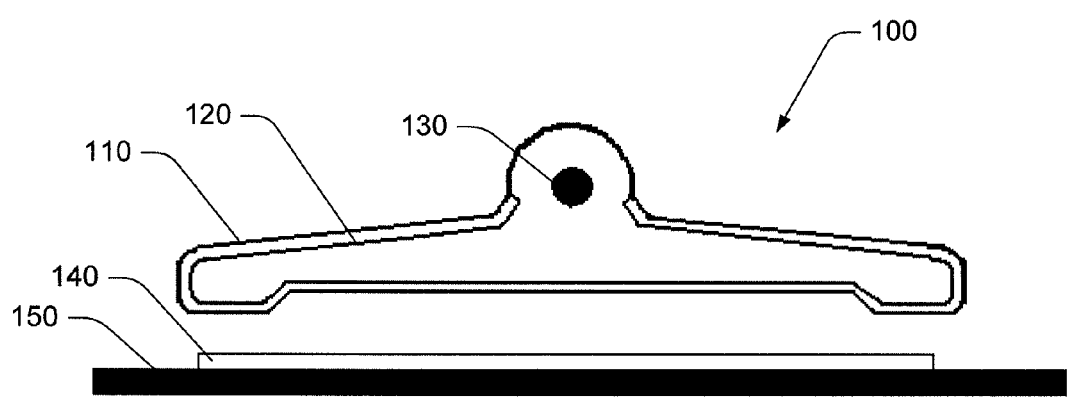
FIG. 1 shows on embodiment of a capacitor sensor for Non-Contact Object Detection (NCOD)

Certain terminology is used herein for convenience only and is not to be taken as a limitation on the embodiments of a capacitor sensor for Non-contact Object Detection (herein after abbreviated as "NCOD"). In the drawings, the same reference letters are employed for designating the same elements throughout the several figures.

The words "right", "left", "front", and "back" designate directions in the drawings to which reference is made. The words "inwardly" and "outwardly" refer to directions toward and away from, respectively, the geometric center of the capacitor sensor for NCOD and designated parts thereof. The terminology includes the words above specifically mentioned, derivatives thereof, and words of similar import.

Like reference numerals designate like or corresponding parts throughout the various views and with particular reference to each of Figures as delineated below.

FIG. 1 shows one embodiment of a capacitor sensor for NCOD. Capacitor sensor 100 includes a ground plane 150 on which double-sided specified insulation tape, not limited to, 140 is mounted. Ground plane 150 may be integrated into part of a vehicle such as a door frame or other part that can be used as a ground plane (usually metal and conductive). The sensor of Capacitor Sensor 100 includes a coating 110 which provides for electrical insulation and environmental protection. Also a Guard layer 120 of conductive coating may be included. Sensor cable 130 integrates the sensor into the control system of FIG. 2. The sensor cable may be 1.5 mm overall with 0.5 mm copper core, not limited to this construction diameter, application dependant The Capacitive Sensor generates an electrical field. Intrusions into this field are detected allowing the motion system to react without contact. The field covers the desired closure aperture depending on the application. This extends from one edge of the closure frame towards the other edge of the closure frame where the two sides meet and form a closure. In some implementations, the field may not extend across the entire opening when it is fully open, but the range will provide for sufficiently early detection of an object for the desired reaction of the closure. Any object intrusion into the field changes the electric field intensity. The capacitive electronics in turn senses that change in field and generate analog voltage proportional to change in field. The motion control microcontroller samples the sensor voltage and decides about the object presence in the field proximity and take necessary action.

The capacitor sensor 100 of FIG. 1 provides a sensor only requiring 2 or 3 electrodes (not limited to), the sensor cable 130 and the Guard 120, optionally a Ground as a third 150. (Dependant on installation site.) The capacitor sensor 100 provides synchronous demodulation which provides for noise immunity and increased sensitivity. The Guard 120 is curved and the sensor cable 130 is molded on the top of the sensor. The sensor provided is immune to water, which in prior sensors might be treated as an object as it would interfere with the capacitance sensor.

Capacitor sensor 100 may be implemented in a variety of contexts. It may be used for both contact and non-contact obstacle detection for such automotive doors as power sliding doors, power lift gate, power sunroof, power windows, and any other powered car door, opening, or compartment, or closure aperture not limited to automotive. The sensor has a configurable range which means it can be adjusted for a variety of situations, applications and automotive requirements, utilizing the same sensor design.

Capacitor sensor 100 can provide digital as well as analog signal to the control system. The digital signal is a pulse width modulated signal, of desired frequency. This signal changes its duty cycle based on the object proximity. The analog signal is from 0-5V. This signal can increase/decrease its voltage as the object approaches toward the sensor, dependant on configuration. The control system consists of a microcontroller based control system, but not limited to. The control system drives and controls the closure systems. The control system has digital, analog input and outputs to interface with the other sensors, modules etc.

Figure 2:
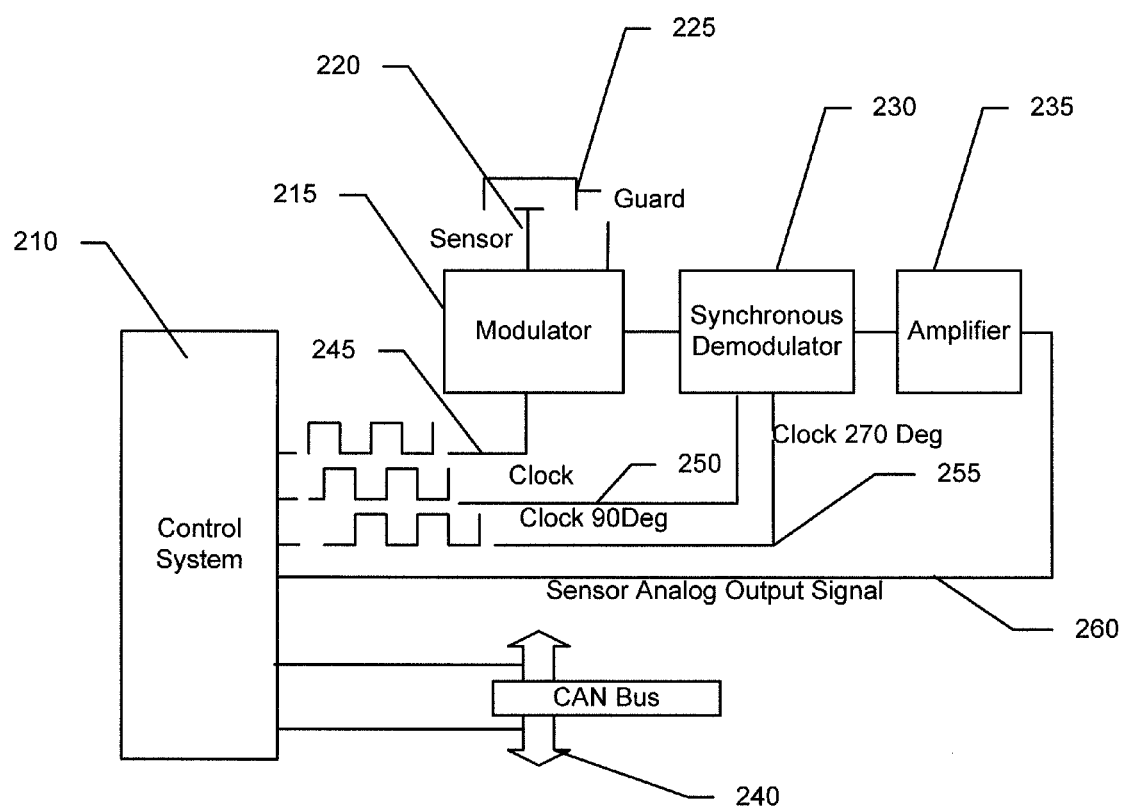
FIG. 2 shows one embodiment of a control system for a capacitor sensor for NCOD.

FIG. 2 shows one embodiment of the control system and associated circuitry for a capacitor sensor 100. The system includes a control system 210 that produces three clock signals, clock signal 245, clock signal 250 (at 90 degrees), and clock signal 245 (at 270 degrees). The control system 210 receives a sensor analog output signal 260 from amplifier 235. The control system 210 may also interact with the Controller Area Network-Bus 240, (can be any communication bus architecture) (herein after "CAN-Bus") which is the controller area network for the vehicle. Through CAN-Bus 240 the motor actuating the door or other system to which the sensor 220 and guard 225 are attached can control the speed and position of the door when an object is in proximity. Clock signal 245 is provided to modulator 215 in order to modulate the sensor signal. The synchronous demodulator 230 receives the amplitude signal from the sensor 220 as well as clock signals 250, 255 which are then demodulated and amplified by amplifier 235.

Figure 3:
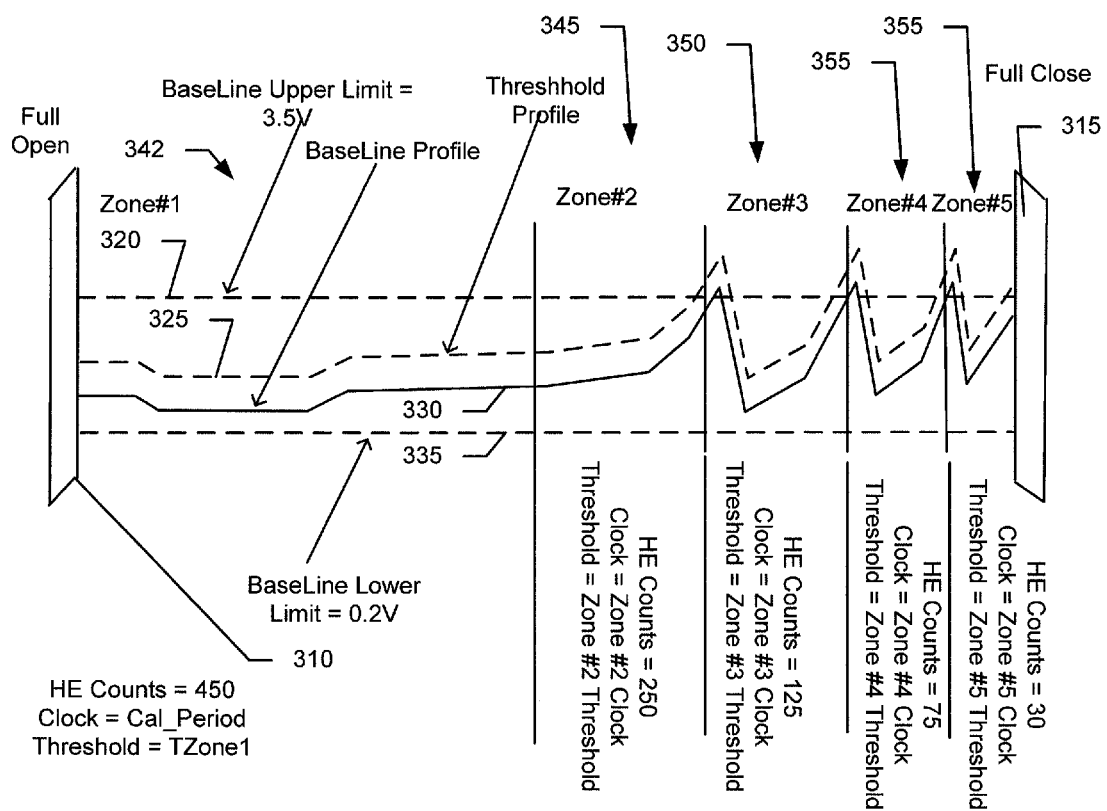
FIG. 3 shows a voltage diagram for the control system and associated circuitry of FIG. 2.

FIG. 3 shows an exemplary voltage diagram for the control system and associated circuitry of FIG. 2. Door frames 310, 315 represent the contact points of a door frame that may be closed into one another, from full open to full close. In this example of a sensor learning diagram, the sensor begins with a base line lower limit 335 and a baseline upper limit 320, which in this example are 0.2V and 3.5V respectively. The sensor detects the voltage experienced at various positions and sets that voltage as the Baseline Profile 330. The base line profile 330 is divided into several zones depending on the complexity on the base line in order to avoid a sensor saturation point. In the zones 342, 345, 350, 355, 360, the baseline profile 325 is established by moving the door from full open position to full close position. The threshold profile 320 is calculated based on the obstacle sensitivity in all zones. In each zone the HE Counts, clock, and Threshold are recorded for future detection of objects in the sensor detection zone. As can be seen in the zones 342, 345, 350, 355, 360 the system operates according to different sampling protocol depending on how close the opening is to being closed. In zone 350 the base line voltage read is over the baseline upper limit 320. Therefore the control frequency is modified to bring the base line 330 under the baseline upper limit 320. Each zone may have the same or different values for the control frequency, Hall Effect counts and threshold limit. Once these zones are established, they are stored in EEPROM/RAM for future use in obstacle detection. The Capacitive Sensor learns through out its life span via cycling, for zone data and updates accordingly.

Figure 4A:
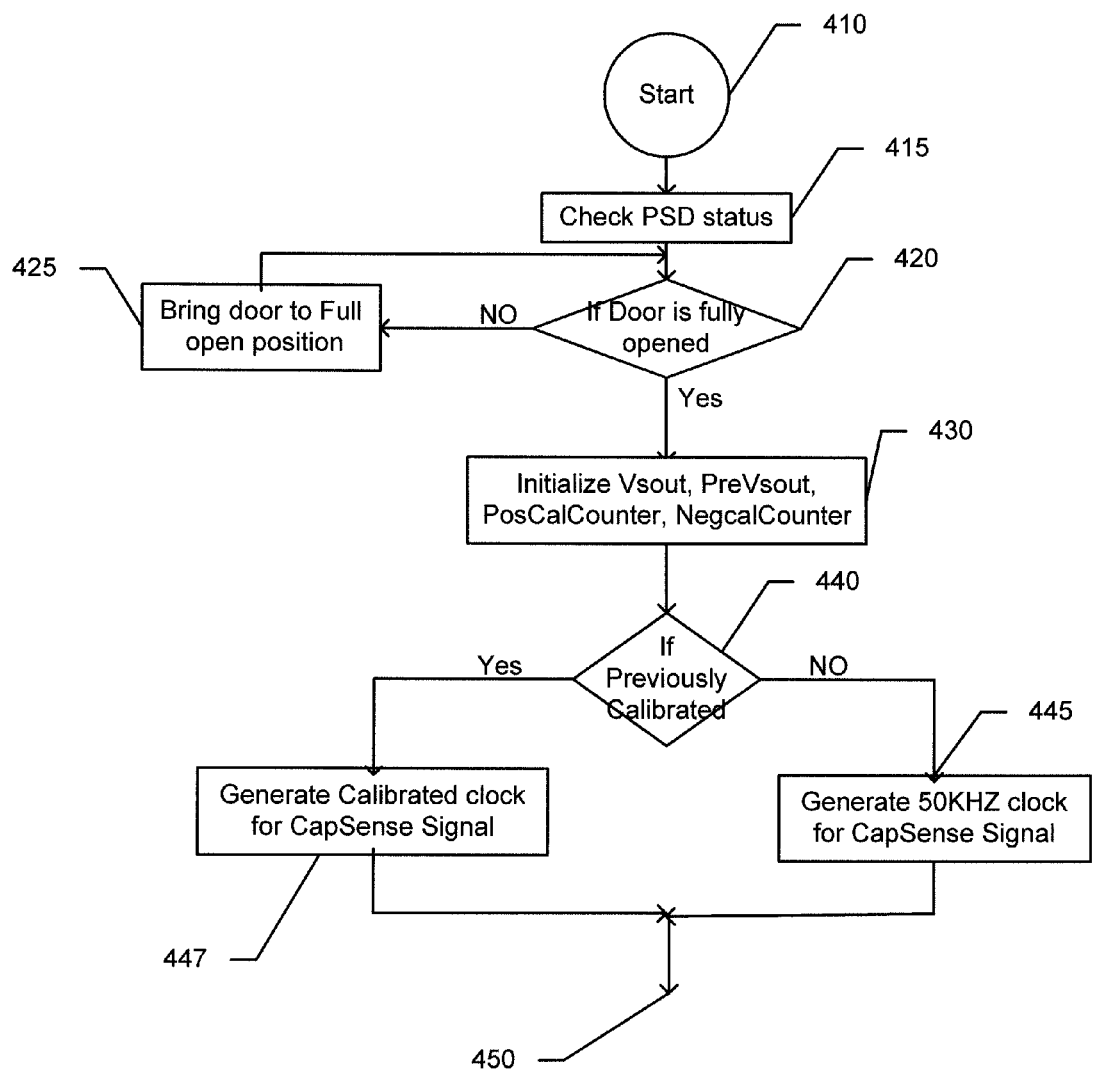
FIGS. 4a and 4b show a flow chart for calibration of one embodiment of a control system for a capacitor sensor for NCOD.
Figure 4B:
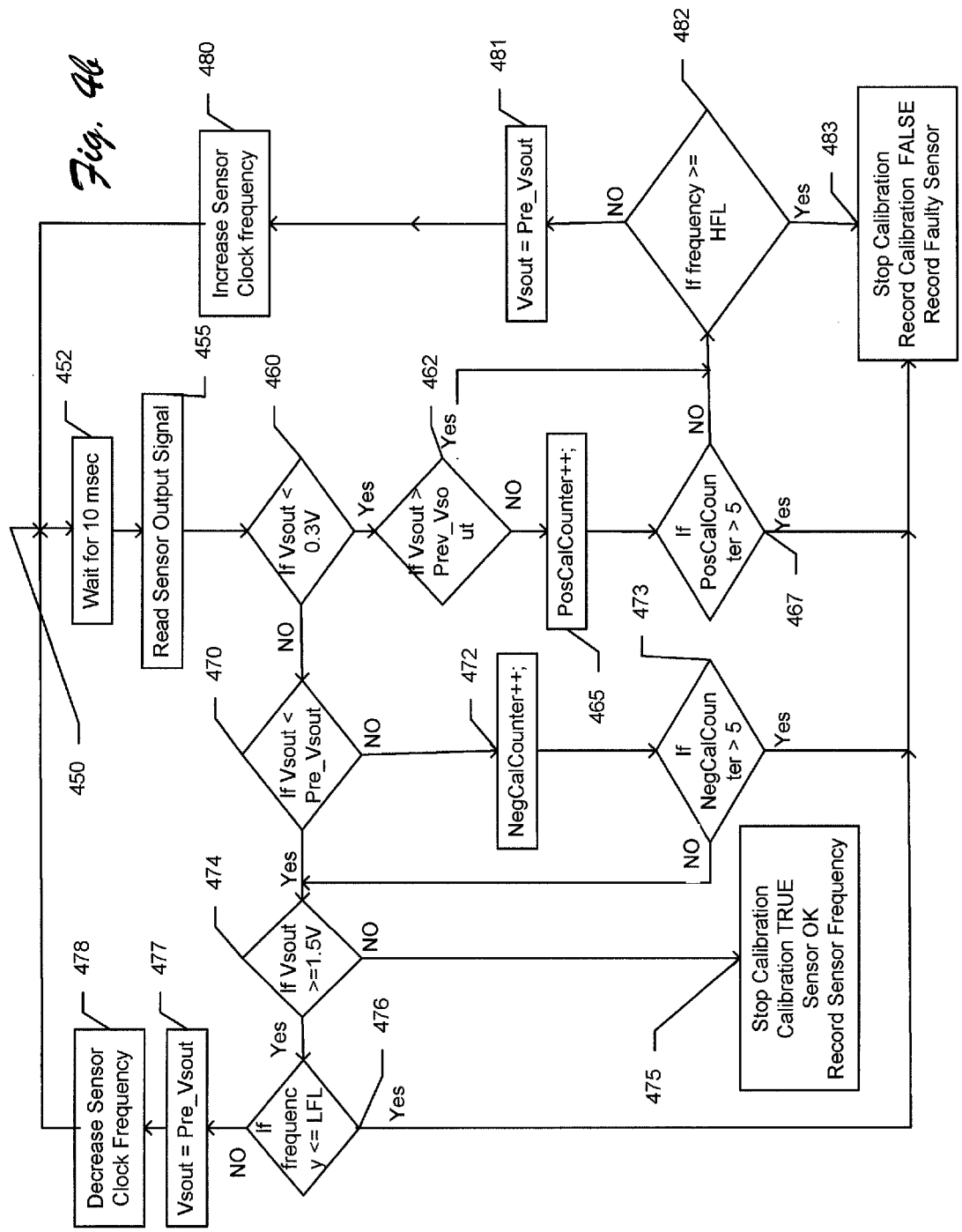

FIGS. 4a and 4b show a sensor calibration algorithm. The process of calibration begins at block 410. The objective is to provide the proper sampling rate and determine the baseline for the sensor. In block 415 the status of the PSD (power sliding door (full open/full close switch)) is checked. In block 420 it is determined whether the door is full open. If not, the process proceeds to block 425 where the door is brought to a complete open state. The position of the door is then checked again in block 420. In block 430 the Vsout (which represents the voltage output from the sensor), the PreVsout (which represents the previous voltage output from the sensor), the positive calibration counter (abbreviated as "PosCal-Counter"), and the negative calibration counter (abbreviated as "NegCalCounter") are initialized.

In block 440 if the system was previously calibrated then the previously calibrated clock signal is used and the flow proceeds to block 447. If not then a default clock signal is generated, such as 50 kHz in block 445. Arrow 450 provides for the flow between FIGS. 4a and 4b which together represent the complete algorithm. In block 452 the system waits for 10 milli-second (ms) in order to adjust and receive a consistent signal. In block 455 the sensor signal is read and set to Vsout. In block 460, if the voltage read is below the baseline lower limit 335 FIG. 3, then the flow proceeds to block 462 where it is determined whether the current voltage reading is higher than the previous voltage reading. If it is, then it means that increasing the clock frequency is providing for a baseline reading that is within the valid threshold for the sensor. The flow proceeds to block 482 where it is determined whether the clock frequency is at the highest frequency level. If yes, the flow continues to block 483 where it is determined that the sensor is faulty since the frequency can no longer be increased to read above the low threshold of the sensor.

Continuing from block 462, if the measured voltage is less than the previous voltage that means the flow will proceed to block 465 where the Positive Calibration Counter will be incremented by 1. Then in block 467 it is determined whether the Positive Calibration Counter is greater than a defined threshold value in this case 5. If so, in block 483 the calibration terminates as that was previously described. If the Positive Calibration Counter has been incremented less than the defined threshold value, then the algorithm proceeds to increase the frequency. This process sets a limit to the number of attempts that the system will make to calibrate before reaching an error condition, i.e. 5 times. In block 482 as described above, it is determined whether the frequency is at its maximum level or not. If it is, then the calibration terminates in block 483. If not, the current voltage measured is set to the Pre-Vsout (the previous voltage measured) for the continuation of the calibration. In block 480 the sensor clock frequency is increased to attempt to increase the baseline voltage minimum measured. Then the process returns to block 452 for another calibration iteration.

Referring back to decision block 460, if the voltage measured is not less than the minimum voltage, and then the algorithm proceeds to decision block 470. In block 470 it is determined whether the current voltage measured is less than the previous voltage measured. If it is measured greater, then the flow proceeds to block 474. In block 474 it is determined whether the current voltage measured is greater than or equal to the maximum voltage. If it is not, then a new baseline calibration is established and the algorithm proceeds to block 475. At block 475 the stop calibration is set to true and the sensor frequency is recorded.

Returning to block 470, if the current voltage measured is less than the previous voltage measured (but already determined to be greater than the low voltage threshold) then in block 472 the negative calibration counter is incremented by 1. In block 473 if the counter has not been incremented more than the defined threshold value 'in this case 5' then the flow proceeds to block 474 where it is again determined whether the currently measured voltage is less than the maximum threshold voltage. If so, a new threshold voltage is set in block 475 as previously described. In block 473, if the counter has been incremented more than the defined threshold value 'in this case 5' then an error is detected and the algorithm proceeds to block 483.

If it is determined in block 474 that the voltage measured is greater than the maximum voltage threshold, then a lower frequency is set. In block 476 it is determined whether the current frequency is less than or equal to the lowest frequency level. If it is less than or equal, then the frequency cannot be lowered any more and the algorithm proceeds to block 483 where it is set that the calibration did not occur and the sensor is faulty (calibration is set to false).

If the frequency can be set lower, then in block 477 the currently measured voltage is set equal to Pre-Vsout, so that in the next cycle of the algorithm it may be compared to the measured voltage. In block 478 the sensor clock frequency is decreased. Then the algorithm returns to block 452 for another attempt at calibration. The processes above continues until the sensor is either marked as calibrated in block 475 or not calibrated in block 483. The reasons for not achieving calibration are too many attempts at lowering the frequency or raising the frequency or the inability to raise or lower the frequency due to the minimum thresholds of the sensor.

In FIGS. 4a and 4b the HFT stands for the high frequency limit, for example 150 kHz, LFT stands for the low frequency limit, for example 25 kHz. The algorithm may be executed after every Power on Reset, every wakeup from sleep mode, and every occurrence of the sensor baseline is out of range. The algorithm may execute after object detection as well. The algorithm of course may be executed at some lesser intervals or greater intervals as well.

Figure 5:
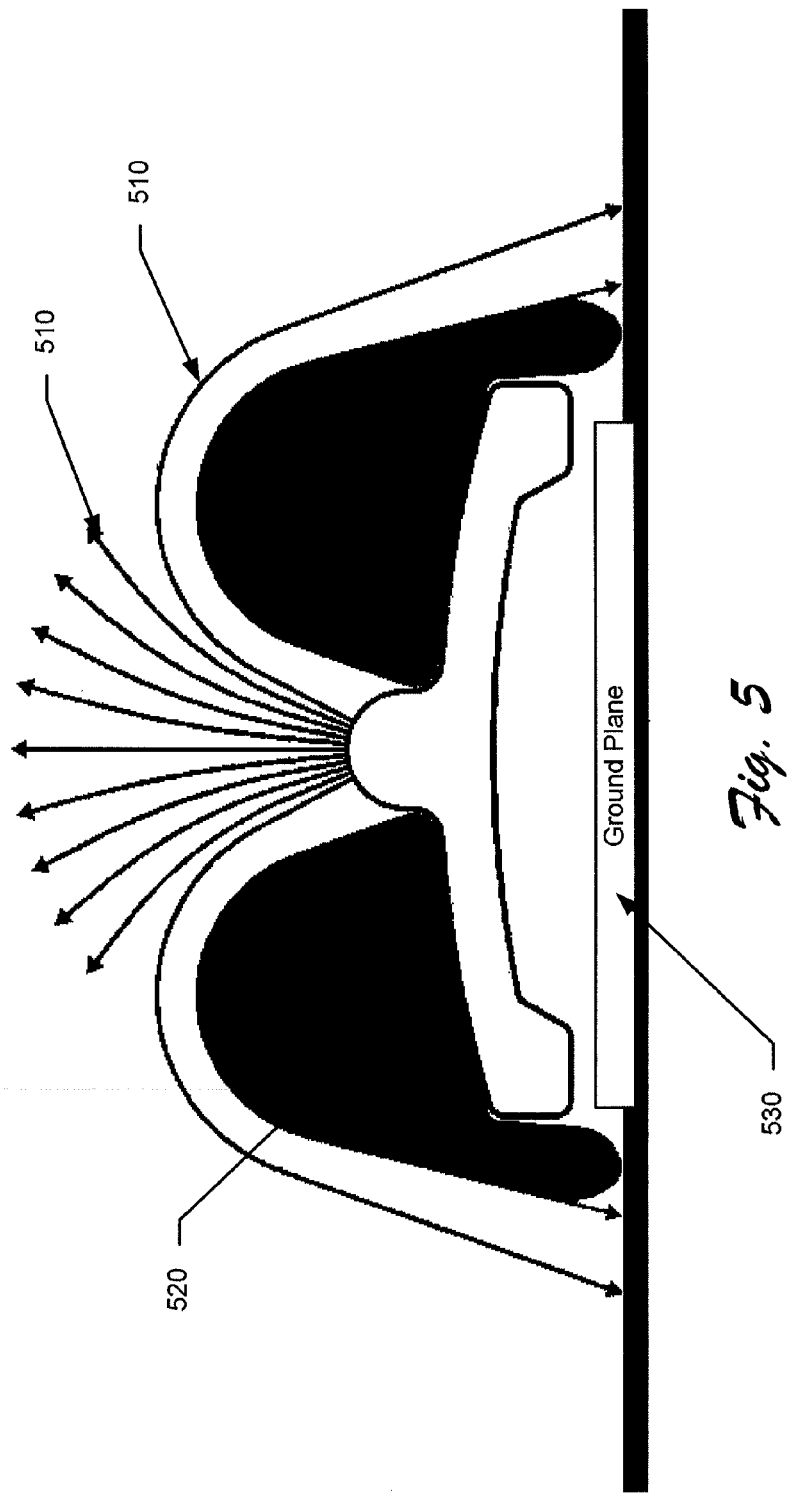
FIG. 5 shows a Flex Cap sensor electric field distribution.
Figure 6:
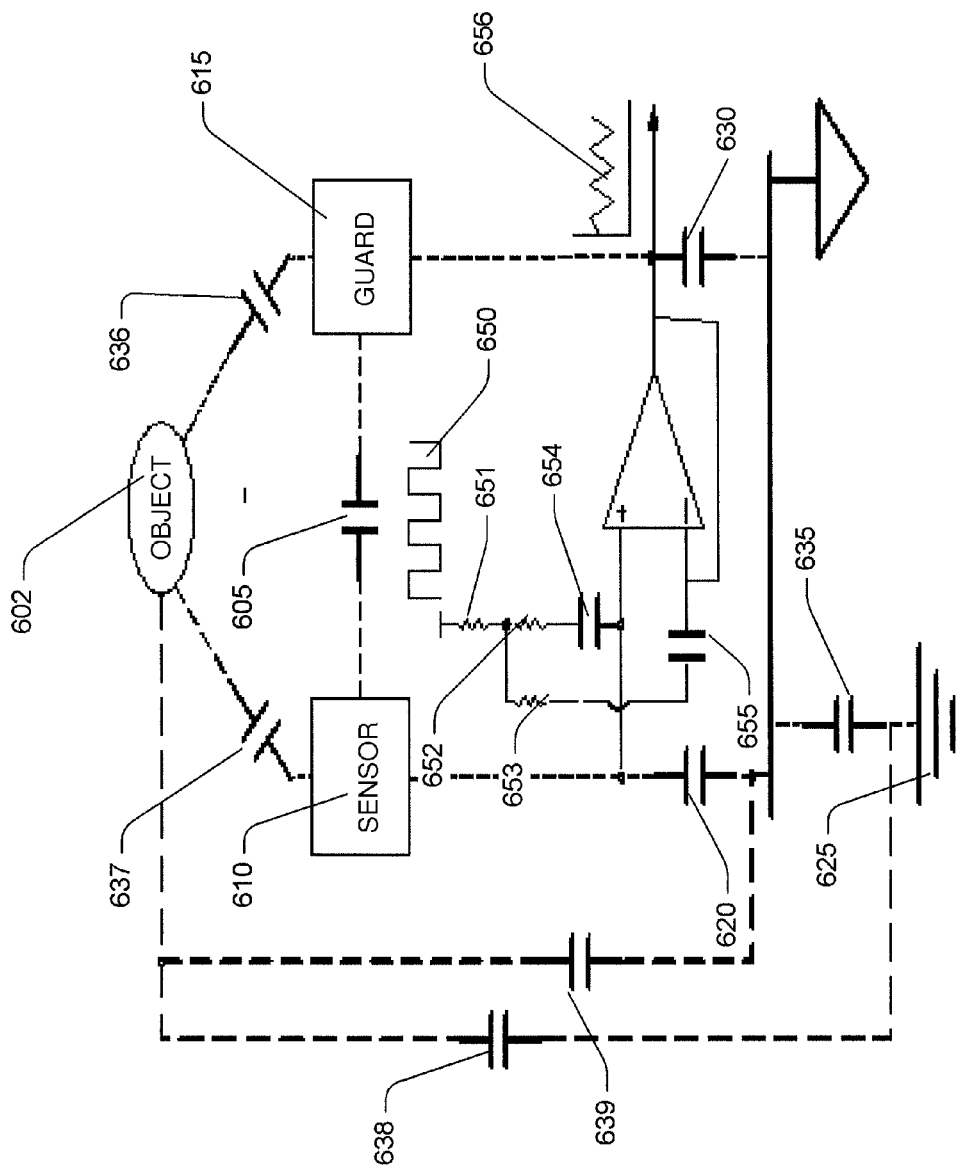
FIG. 6 shows the Flex Cap Sensor Capacitive Model.

FIG. 5 shows that guard electric field 520 helps to focus the sensor wire electric. The sensor electric field 510 takes a long travel before terminating to GND 530. This helps to increase sensor detection range FIG. 6 shows the Flex Capacitive Sensor capacitive model for object 602.

C0 605—This is the capacitance between the sensor 610 and guard 615. It depends on the sensor geometry and remains fixed for the entire lifespan of the sensor. Moisture seeping into the sensor 610 between the sensor 610 and guard 615 could increase this capacitance. As seen from the FIG. 1 the guard 610 and sensor 615 are at the same potential, so effectively there is no active capacitance between the sensor 610 and guard 615. It has a very low effect on the modulating output signal C1 620—capacitance between the sensor 610 and Battery GND 625. This is the signal capacitance for the sensor electronics. It has very high gain (1000 times) as compared to the other capacitances. The Flex capacitive sensor can resolve 0.05 pF of signal capacitance C2 630—Capacitance between Guard plate 615 and Battery GND 625. This is normally very high capacitance, in the range of 1-5 nF, as compared to all the other associated capacitances. It depends on the sensor geometry, guard width and separation between guard 615 and battery GND 625. Environmental effects could change that capacitance but it has very minimal effect on the output signal. Gain of C0 605 and C2 630 signal capacitance has 1/1000 times then C1 620 signal.

C3 635, C4 636, C5 637, C6 638, C7 639 Object proximity based capacitances as explained in FIG. 1. C4 636, the object to Guard capacitance is having a minimal impact, as this is associated to guard capacitance. The others C3,C5,C6,C7 have very significant effect as it adds up to sensing signal. The system also includes excitation signal 650, resistors 651, 652, 653, capacitors 654, 655, and demodulator signal 656.

The net signal capacitance=Cnet=(C1∥(C5+((C7+C3) ∥C6)))

4.1 Here + denote the series combination and ∥ denote parallel combination

Figure 7:
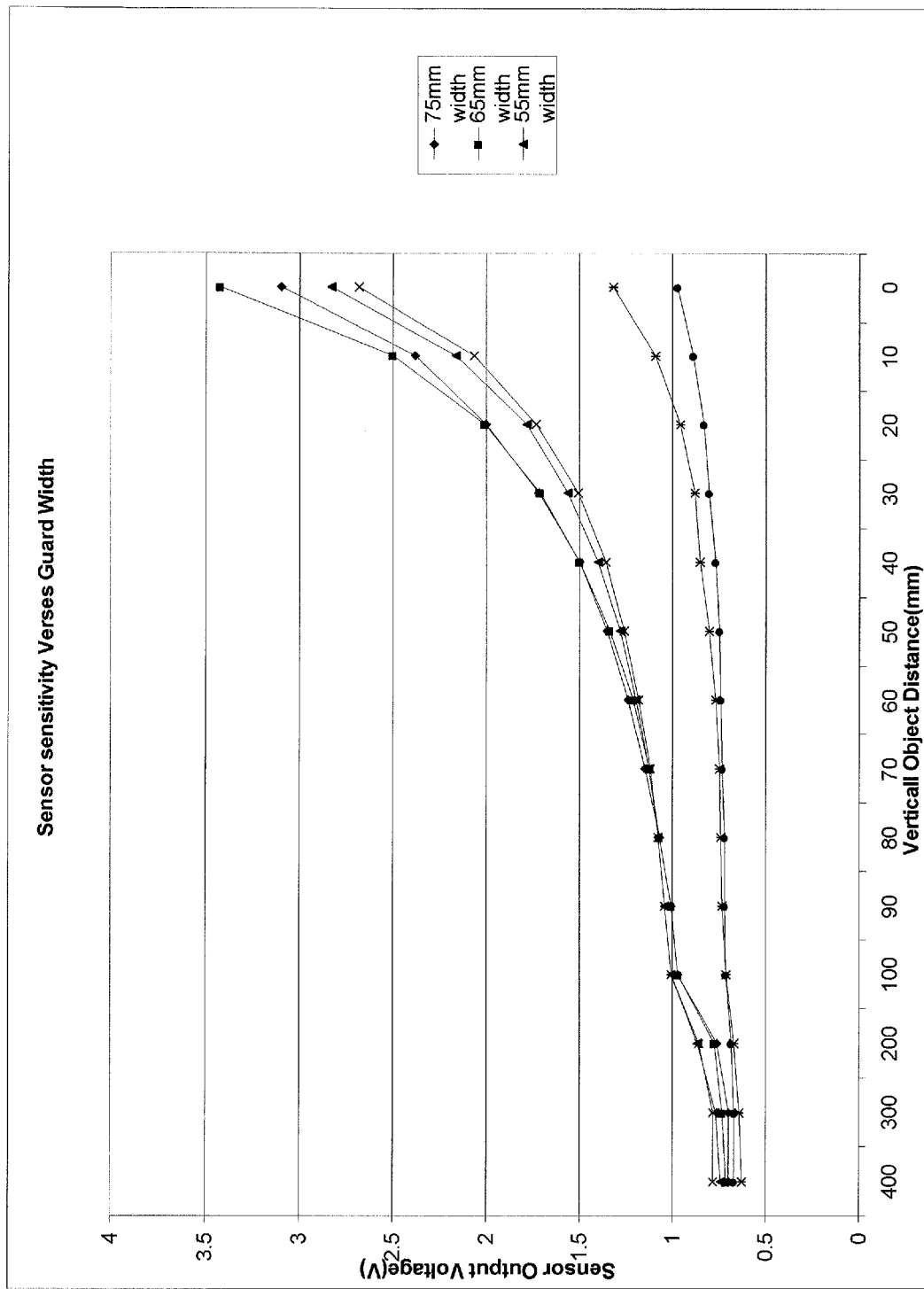
FIG. 7 shows experimental data of guard width verses sensor sensitivity.

FIG. 7. Experimental result: guard width verses sensor range.

An experiment was design to study the sensor detection range with respect to guard width. Keeping the excitation voltage constant, change the guard width from 15 mm to 75 mm and record the sensor output voltage for a fixed obstacle size at distance from 0-400 mm. The fig. Shows that increasing the guard width, the sensor sensitivity increases significantly from 0-100 mm and very small after word. This means that sensor with a wider guard plate can detect a object at a longer distance.

Figure 8:
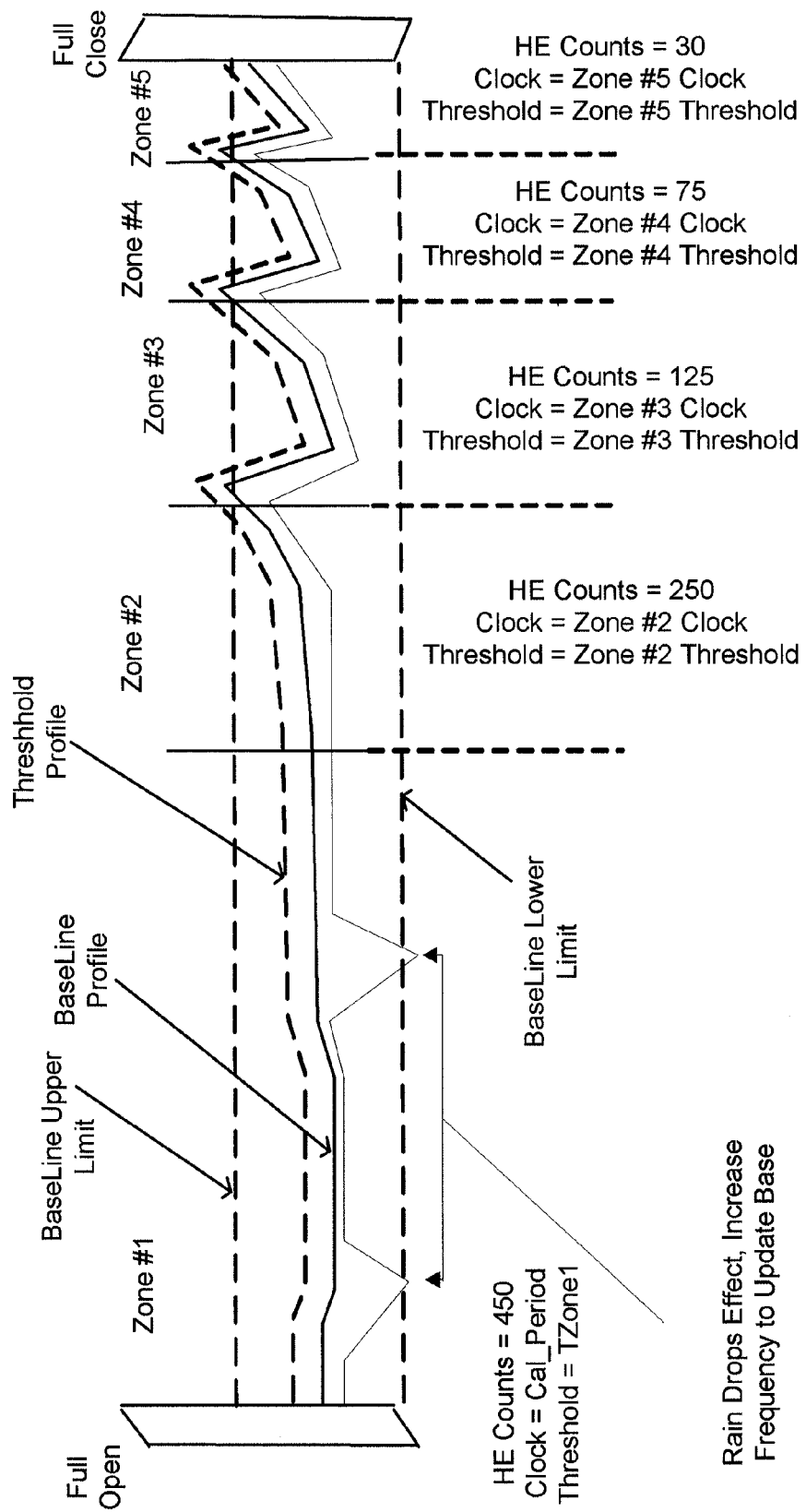
FIG. 8 shows the Capacitive Sensor water-rain immunity.

FIG. 8. Capacitive Sensor rain-water immunity algorithm.

Red line shows the real time data from the sensor. When rain or water drop land on the sensor surface, the sensor voltage drop down. This is a clear difference between water and a real object. In the case of the any object in-front of the sensor surface, the sensor voltage increases. The rain drop effect line in FIG. 8 shows the two voltage dips due to water drops on the sensor surface. The sensor control electronics detects the voltage dips and correspondingly adjust to new frequency to compensate for the water effect. The change in frequency will depend on the sensor gain For example, presents sensor electronics has a gain of 50ATD counts per one step change in frequency.

If V1=base line voltage at a particular door position

V2=voltage dip due to water-rain

Then change in voltage=V2−V1

Increase in frequency to compensate water effect and achieve the base line=(V2−V1)/50.

The algorithm above is exemplary of a calibration algorithm and the attempts for raising or lowering the frequency before setting the calibration to false may be changed at the preference of the sensor designer. Furthermore, aspects such as the initial frequency or the upper and lower threshold limits will vary according to the sensor used. Typically, once installed the initial frequency, number of attempts, and threshold limits will be set prior to installation. They may vary according to the exact design of the sensor of course.

Such a calibration algorithm in conjunction with the described capacitor sensor may be calibrated automatically and periodically, even once the vehicle is provided to a consumer. This ensures a maximum level of safety and provides assistance against sensor failures without having to provide for extensive repairs and calibration. Furthermore, a generic capacitor sensor may be deployed in a variety of situations without having to specifically configure the sensor, except for the above calibration algorithm.

Other features include:

Mechanical Design for physical sensor+Sensor directionality design, water immunity encompassed within design as a result;

A Capacitive driver integrated into control electronics;

Automatic calibration system to cope with environmental variables;

Rain/water immune;

Proximity based speed control algorithm;

Object detection, recognition and closure system stoppage/reversal algorithm;

Smart environment learning algorithm;

System is configurable for Non-contact obstacle detection, proximity based speed control or touch based anti-pinch system—on the fly;

Sensor is one piece and or 2, not limited to;

The sensor can be divided into different zones along the length of the sensor, which can be activated/deactivated dynamically as per the application;

In addition to the zones, 'dead' zones (areas that are shielded with the guard/sections) may be created whereas the sensor must navigate around a metal feature in the geometry of the application to fit;

Sensor electrode (cap sensor) may accommodate the closure system accessories, i.e. door stabilizers, rubber bumper/feature, may contain metallic insert molded screws along bottom portion of sensor body.

While specific embodiments have been described in detail in the foregoing detailed description and illustrated in the accompanying drawings, it will be appreciated by those skilled in the art that various modifications and alternatives to those details could be developed in light of the overall teachings of the disclosure and the broad inventive concepts thereof. Portions of algorithms described herein may be referred to as modules, instructions, program segments and other terms known to those skilled in the art; however these terms are used for convenience of description and are not intended to require separation of functionality or instructions. The systems and algorithms described herein may be implemented in a microprocessor executing software, an integrated circuit, a FPGA (field programmable gate array), other circuitry and/or combinations thereof. It is understood, therefore, that the scope of the capacitor sensor for NCOD is not limited to the particular examples and implementations disclosed herein, but is intended to cover modifications within the spirit and scope thereof as defined by the appended claims and any and all equivalents thereof.

What is claimed as new and desired to be protected by Letters Patent of the United States is:

1. A non-contact object detection system comprising:
   (a) a capacitor sensor; and
   (b) a control system, the control system providing an Adaptive Excitation Signal (AES) to the capacitor sensor, the AES configured according to a power closure system including a proximity based speed control algorithm in which the capacitor sensor is deployed;
   wherein the capacitor sensor provides a detection voltage to the control system when an object is in the detection area and the AES configured to produce a threshold voltage from the capacitor sensor to the control system in the power closure system when an object is not in a detection area of the capacitor sensor;
   wherein the control system is configured to execute instructions for automatically configuring the AES, the instructions including a module for determining whether the threshold voltage is within an upper baseline limit and a lower baseline limit of the capacitor sensor and adjusting the AES according to the power closure system to achieve a desired base line profile to be within upper and lower limits.

2. The non-contact object detection system claim 1, wherein the system is immune to water affecting sensor characteristics.

3. The non-contact object detection system claim 1, wherein the non-contact object detection system is integrated into the power closure system.

4. The non-contact object detection system claim 1, wherein the power closure system includes an object detection, recognition, and closure stoppage/reversal system.

5. The non-contact object detection system claim 3, wherein the power closure system includes a touch based anti-pinch system.

6. The non-contact object detection system of claim 1, further comprising:
   (c) a modulator configured to receive a first clock signal from the control system, the modulator interconnected with the capacitor sensor;
   (d) a synchronous demodulator configured to receive a first signal from the capacitor sensor, a second clock signal from the control system, and a third clock signal from the control system and demodulate the signal from the capacitor sensor; and
   (e) an amplifier configured to amplify a second signal from the synchronous demodulator and provide an analog output signal to the control system, the analog output signal indicative of whether an object is in the detection area.

7. The non-contact object detection system of claim 1 wherein the capacitor sensor includes a guard and the guard is covered with an environmentally protective coating paint, the environmentally protective coating providing waterproofing to the sensor.

8. A method of detecting an object in a detection area of a capacitor sensor deployed in a closure, the method comprising:
   providing an Adaptive Excitation Signal (AES) to the capacitor sensor from a control system in a power closure system including a proximity based speed control algorithm;
   configuring the AES according to a power closure system including a proximity based speed control algorithm in which the capacitor sensor is deployed, wherein the AES is automatically configured to produce a threshold voltage from the capacitor sensor to the control system in the power closure system when an object is not in a detection area of the capacitor sensor;
   sensing a detection voltage produced from the capacitor sensor;
   comparing the detection voltage to a threshold voltage; and
   determining whether the object is in the detection area based on the comparing.

9. The method of claim 8, wherein the instructions include adjusting the AES in order to set the threshold voltage between an upper and lower baseline for the capacitor sensor.

10. The method of claim 9, wherein the instructions include adjusting the AES to a lower frequency if the threshold voltage is not less than the upper baseline.

11. The method of claim 10, wherein the instructions include adjusting the AES to a higher frequency if the threshold voltage is not greater than the lower baseline.

12. The method of claim 11, wherein the instructions include providing an indication that the capacitor sensor is faulty if the AES cannot be adjusted to provide a threshold voltage between the upper and lower baseline.

* * * * *

UNITED STATES PATENT AND TRADEMARK OFFICE
CERTIFICATE OF CORRECTION

PATENT NO. : 9,068,816 B2
APPLICATION NO. : 13/302511
DATED : June 30, 2015
INVENTOR(S) : Grills et al.

Page 1 of 1

It is certified that error appears in the above-identified patent and that said Letters Patent is hereby corrected as shown below:

IN THE CLAIMS
Claim 9, column 10, line 17, after the words "claim 8", delete "wherein the instructions include" and insert therefor --further comprising--.

Claim 10, column 10, line 20, after the words "claim 9", delete "wherein the instructions include" and insert therefor --further comprising--.

Claim 11, column 10, line 23, after the words "claim 10", delete "wherein the instructions include" and insert therefor --further comprising--.

Claim 12, column 10, line 26, after the words "claim 11", delete "wherein the instructions include" and insert therefor --further comprising--.

Signed and Sealed this
Thirtieth Day of August, 2016

Michelle K. Lee
*Director of the United States Patent and Trademark Office*